United States Patent [19]
Martinez et al.

[11] Patent Number: 6,137,809
[45] Date of Patent: Oct. 24, 2000

[54] QUANTIZATION NOISE COMPENSATOR APPARATUS AND METHOD

[75] Inventors: Rafael S. Martinez, Clearwater; William L. Betts, St. Petersburg, both of Fla.

[73] Assignee: Paradyne Corporation, Largo, Fla.

[21] Appl. No.: 08/993,471

[22] Filed: Dec. 18, 1997

[51] Int. Cl.[7] .............................. H04J 3/06; H04B 14/06; H03M 3/00
[52] U.S. Cl. ........................ 370/503; 375/245; 341/143
[58] Field of Search ............................ 370/503; 341/76, 341/77, 143, 144; 375/245, 247, 256

[56] References Cited

U.S. PATENT DOCUMENTS

| | | | |
|---|---|---|---|
| 5,030,952 | 7/1991 | Ledzius et al. | 341/143 |
| 5,124,703 | 6/1992 | Kaneaki et al. | 341/143 |
| 5,424,739 | 6/1995 | Norsworthy et al. | 341/143 |
| 5,471,209 | 11/1995 | Sutterlin et al. | 375/245 |

OTHER PUBLICATIONS

Aziz, Sorensen, and Der Spiegel, "An Overview of Sigma–Delta Converters How a 1–Bit ADC Achieves more than 16–Bit Resolution", IEEE Signal Processing Magazine, Jan. 1996, pp. 61–84.

*Primary Examiner*—Chi H. Pham
*Assistant Examiner*—Steven Nguyen
*Attorney, Agent, or Firm*—Thomas, Kayden, Horstemeyer & Risley, L.L.P.

[57] ABSTRACT

An improvement to a half duplex multipoint communication environment wherein a pilot tone enables a control device to maintain synchronization with a plurality of remote devices. The present invention employs a quantization noise compensator apparatus and method to supply a single bit, two level analog signal to drive a Voltage Controlled Crystal Oscillator (VCXO) in a remote device. The VCXO derives the sample rate signal for both transmit and receive devices, eliminating the requirement for a highly accurate digital to analog converter, thus reducing the cost and complexity of the system while allowing continuous synchronization between a control device and a plurality of remote devices.

30 Claims, 6 Drawing Sheets

QUANTIZATION NOISE COMPENSATOR APPARATUS AND METHOD

CROSS REFERENCE TO RELATED APPLICATION

This document claims priority to and the benefit of the filing date of copending and commonly assigned U.S. Provisional Patent Application entitled QUANTIZATION NOISE COMPENSATOR, assigned Ser. No. 60/057,046, and filed Aug. 22, 1997 and is hereby incorporated by reference.

FIELD OF THE INVENTION

The present invention relates generally to data communications, and more particularly, to an apparatus and method for canceling noise in a control loop, primarily in communication devices, with the invention being applicable to any control system incorporating an integrator in a feedback loop.

BACKGROUND OF THE INVENTION

The field of data communications typically uses a device, such as a modem, to convey information from one location to another. Digital Subscriber Line (DSL) technology now enables modems to communicate rapidly large amounts of data. Modems communicate by modulating a baseband signal carrying digital data, converting the modulated digital data signal to an analog signal, and transmitting the analog signal over a conventional copper wire pair using techniques that are known in the art. These known techniques include mapping the information to be transmitted into a signal space constellation, encoding the information to reduce errors and improve throughput, and transmitting the information over a communication channel. The constellation can include both analog and digital information or often merely digital information.

At a receiver, the constellation is received, equalized and decoded in accordance with techniques that those skilled in the art will appreciate.

In the above mentioned communications system, a control device, i.e., one that is located at a telephone company central office, connects over the communication channel to a plurality of remote devices typically located at a customer residential or business location. This topography is known as a multipoint communication environment because one control device is communicating with a plurality of remote devices over a single communication channel. The communication technique between the control modem and the remote modems is generally half duplex in nature, meaning that only one device may transmit at any particular time. In order to establish a communications connection between the central office modem and any of the remote modems, a lengthy preamble, which allows the modems to synchronize at the start of each message is required. Existing techniques such as carrierless amplitude/phase modulation (CAP) and discrete multitone (DMT) modulation allow modems to transmit simultaneously between only two modems at a time. In a multipoint environment, greater circuit efficiency is possible because of the ability to connect multiple modems to the same communication channel.

In a 4 wire communications environment, the control device can transmit continuously so that outbound preambles (from central office to remote location) are unnecessary, thus assuring remote device synchronization. In a 2 wire multipoint environment, as contemplated by the present invention, when a remote device transmits, it disrupts the outbound control signal from the control device preventing all remote devices connected to the communication line from maintaining synchronization with the control device. It is desirable to allow all remote devices to continuously maintain synchronization with the control device in order to significantly reduce the training preamble necessary to establish a communication path between a remote device and the control device. A technique to accomplish this continuous synchronization is described in commonly assigned copending U.S. patent application Ser. No. 08/936,415, titled "PILOT TONE SYSTEM AND METHOD TO ALLOW CONTINUOUS SYNCHRONIZATION IN MULTIPOINT NETWORKS" filed on Sep. 25, 1997, and is hereby incorporated by reference. Part of the system disclosed in the aforementioned application requires the use of highly accurate digital to analog (DAC) converters to supply an analog control signal to a voltage controlled crystal oscillator (VCXO). It would be desirable to provide the modem synchronization function described, at a reduced level of complexity and cost by simplifying the manner in which the analog control signal is developed and supplied to the VCXO.

SUMMARY OF THE INVENTION

The present invention provides an improvement to a half duplex multipoint communication environment by enabling a control device to maintain constant synchronization with a plurality of remote devices using a less complex, less expensive system. By employing the quantization noise compensation apparatus and method, the DAC converter, which supplies an analog control signal required to drive analog devices in phase locked loops (PLL) such as an integrator like a VCXO, can be replaced with a relatively simple quantization noise compensator, referred to hereinafter as a quantizer.

The present invention provides an apparatus for noise compensation, the apparatus comprising a first adder configured to receive a control signal and add the control signal to an accumulated quantization error signal resulting in a combined signal. Also included is a masker configured to convert the combined signal to a plurality of voltage levels. This plurality of voltage levels, which can be linear or nonlinear, is then supplied to a subtractor configured to subtract the plurality of levels from the control signal resulting in a quantization error signal. A second adder configured to add an accumulated quantization error signal with the quantization error signal resulting in a new accumulated quantization error signal is also included. The accumulated quantization error signal is stored in a memory device and used for compensating subsequent samples. The control signal supplied to the first adder can be a 16 bit or 32 bit signal. In the case of a multidimensional signal, the memory device can be n-dimensional.

The present invention also includes a method for noise compensation, the method comprising the steps of adding a control signal with an accumulated quantization error signal resulting in a combined signal. This combined signal is converted by a masking operation to a plurality of voltage levels. The plurality of voltage levels are subtracted from the control signal resulting in a quantization error signal. The accumulated quantization error signal is added to the quantization error signal resulting in a new accumulated quantization error signal, which is stored in a memory device. The memory device may be single or multidimensional depending on the application. Furthermore, the control signal supplied can be a 16 bit or a 32 bit signal.

In an alternative embodiment, the present invention provides an apparatus for correcting bias in a feedback loop, the apparatus comprising a subtractor configured to receive an error signal and subtract an accumulated quantization error signal therefrom, resulting in a combined signal. A Beta scalar receives the combined signal and is configured to convert the combined signal to a bias free error signal. An adder configured to add the bias free error signal with the accumulated quantization error signal resulting in a new quantization error signal is also included. The accumulated quantization error signal is stored in a memory device. Similarly to that described in the first embodiment, the error signal in this alternative embodiment can be 16 bits or 32 bits. Furthermore, in the case of a multidimensional signal, the memory device can be n-dimensional.

This alternative embodiment also includes a method for correcting bias in a feedback loop, the method comprising the steps of receiving an error signal in a subtractor. The subtractor is configured to subtract an accumulated quantization error signal from the error signal resulting in a combined signal. This combined signal is converted to a bias free error signal, which is added to the accumulated quantization error signal resulting in a new quantization error signal. The new quantization error signal is then stored in a memory device and the bias free error signal is used to correct bias in the feedback loop.

The invention has numerous advantages, a few of which are delineated hereafter, as merely examples.

An advantage of the present invention is that it eliminates the need for an accurate digital to analog converter for driving an analog device.

Another advantage of the present invention is that it reduces the cost of control circuitry by eliminating the DAC from phase locked loops that use an integrator.

Another advantage of the invention is that it can be used to remove the bias, or DC offset, from the error signal used to update adaptive equalizer coefficients used in communication devices.

Another advantage of the present invention is that it eliminates the necessity for double precision arithmetic usually required for storing equalized coefficients, thus minimizing the amount of memory space required.

Another advantage of the present invention is that it is simple in design, reliable in operation, and its design lends itself to economical mass production in modems.

Other features and advantages of the present invention will become apparent to one with skill in the art upon examination of the following drawings and detailed description. It is intended that all such additional features and advantages be included herein within the scope of the present invention, as defined in the appended claims.

BRIEF DESCRIPTION OF THE DRAWINGS

The present invention, as defined in the claims, can be better understood with reference to the following drawings. The components within the drawings are not necessarily to scale relative to each another, emphasis instead being placed on clearly illustrating the principles of the present invention.

DETAILED DESCRIPTION OF THE PREFERRED EMBODIMENT

The present invention can be implemented in software, hardware, or a combination thereof. In the preferred embodiment, the elements of the present invention are implemented in software that is stored in a memory and that configures and drives a suitable digital signal processor (DSP) situated in a communication device. However, the foregoing software can be stored on any computer-readable medium for transport or for use by or in connection with any suitable computer-related system or method. In the context of this document, a computer-readable medium is an electronic, magnetic, optical, or other physical device or means that can contain or store a computer program for use by or in connection with a computer-related system or method.

Figure 1:
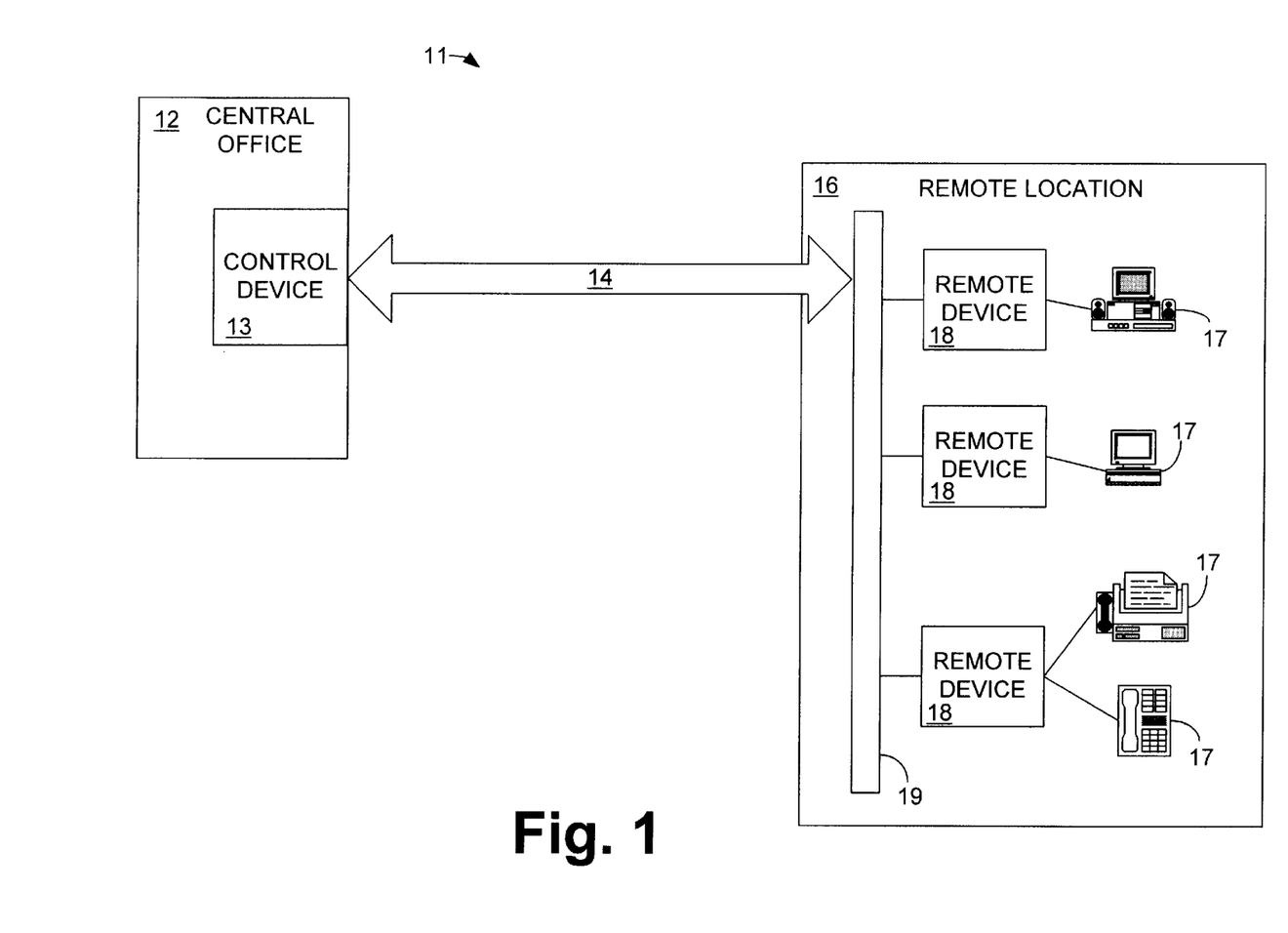
FIG. 1 is a schematic view illustrating a multipoint communications environment.

FIG. 1, shows a schematic view illustrating a multipoint communications environment 11 in which devices employing the quantization noise compensator of the present invention are used. Remote location 16 is connected to central office location 12 via communication channel 14. Located at central office location 12 is control device 13. Communication channel 14 is typically the copper wire pair that extends between a telephone company central office and a remote residential, business, or any other location served by local telephone service. Remote location 16 may contain a plurality of remote devices 18 connecting a plurality of user devices 17 to communication channel 14 via communication bus 19. Communication bus 19 is illustratively the copper wiring infrastructure used throughout a remote location to connect remote devices 18 to communication channel 14. By using control device 13 and remote devices 18 employing the concepts and features of one embodiment of the present invention, it is possible for control device 13 to transmit, and remote devices 18 to receive a pilot tone, using an improved quantization noise compensator apparatus and method, thereby allowing all remote devices 18 to maintain continuous synchronization with control device 13, and enabling control device 13 to maintain continuous synchronization with each of a plurality of remote devices 18.

Figure 2:
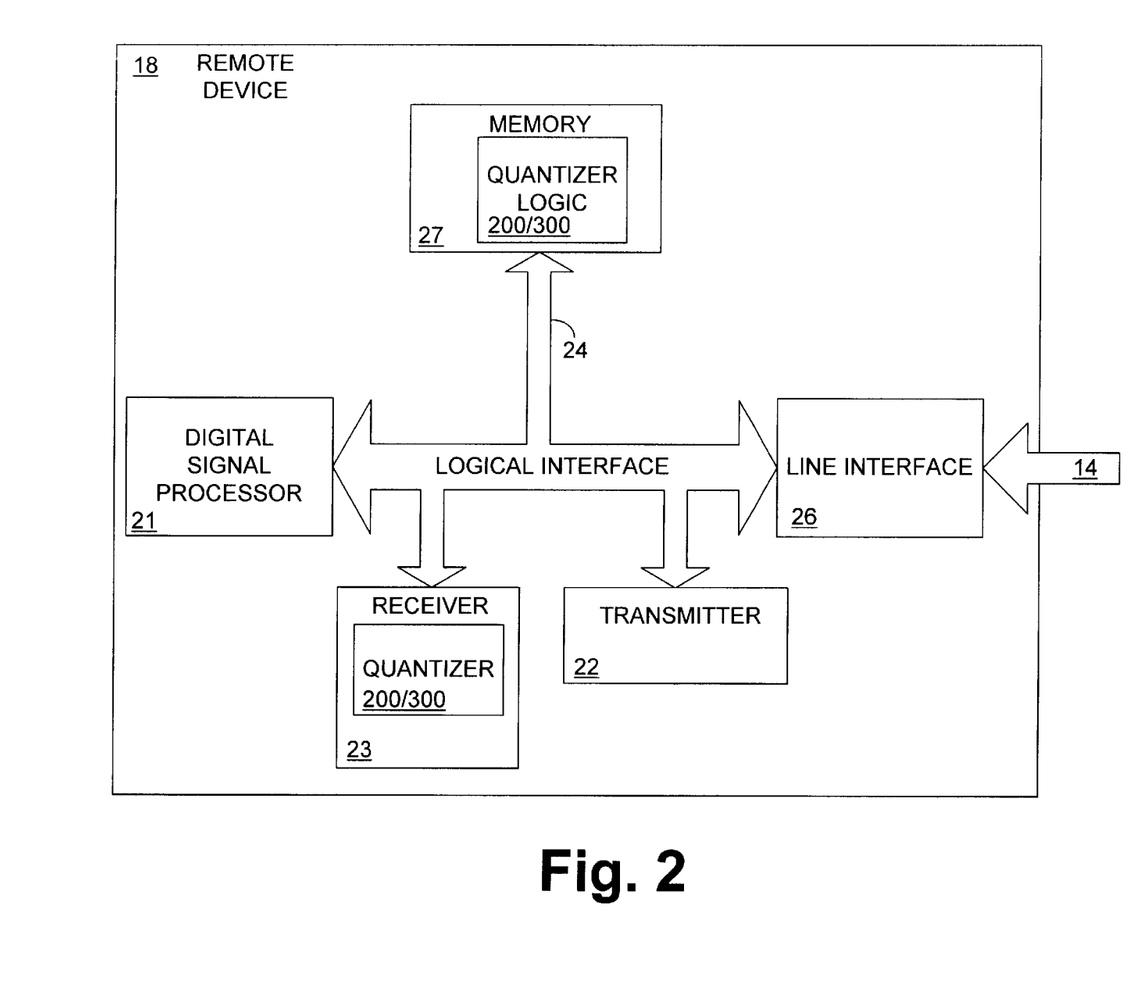
FIG. 2 is a block diagram of a communications device including the quantizer of the present invention.

Now referring to FIG. 2, shown is a schematic view illustrating remote device 18 of FIG. 1 including the quantizer of the present invention. Elements of the present invention reside both in control device 13 and remote devices 18. Typically, control device 13 will transmit a pilot tone signal to remote devices 18. Remote devices 18 contain the quantization noise compensator of the present invention which enables the remote devices to efficiently receive and lock timing to the pilot tone signal sent by control device 13.

Still referring to FIG. 2, remote device 18 contains conventional components as is known in the art of data communications. Digital Signal Processor (DSP) 21 controls the operation of the devices' transmitter 22 and receiver 23 through logical interface 24, and couples to line interface 26 to gain access to communications channel 14. Also included in receiver 23 of remote device 18 is quantizer 200/300 which enables remote device 18 to reliably and economically maintain synchronization with control device 13 by providing, in this first embodiment, noise compensation. In an alternative embodiment, quantizer 200/300 efficiently corrects bias in a feedback loop. Also included in remote device 18 is memory 27, which contains quantizer logic 200/300. Quantizer logic 200/300 is designed to configure and drive DSP 21.

Figure 3:
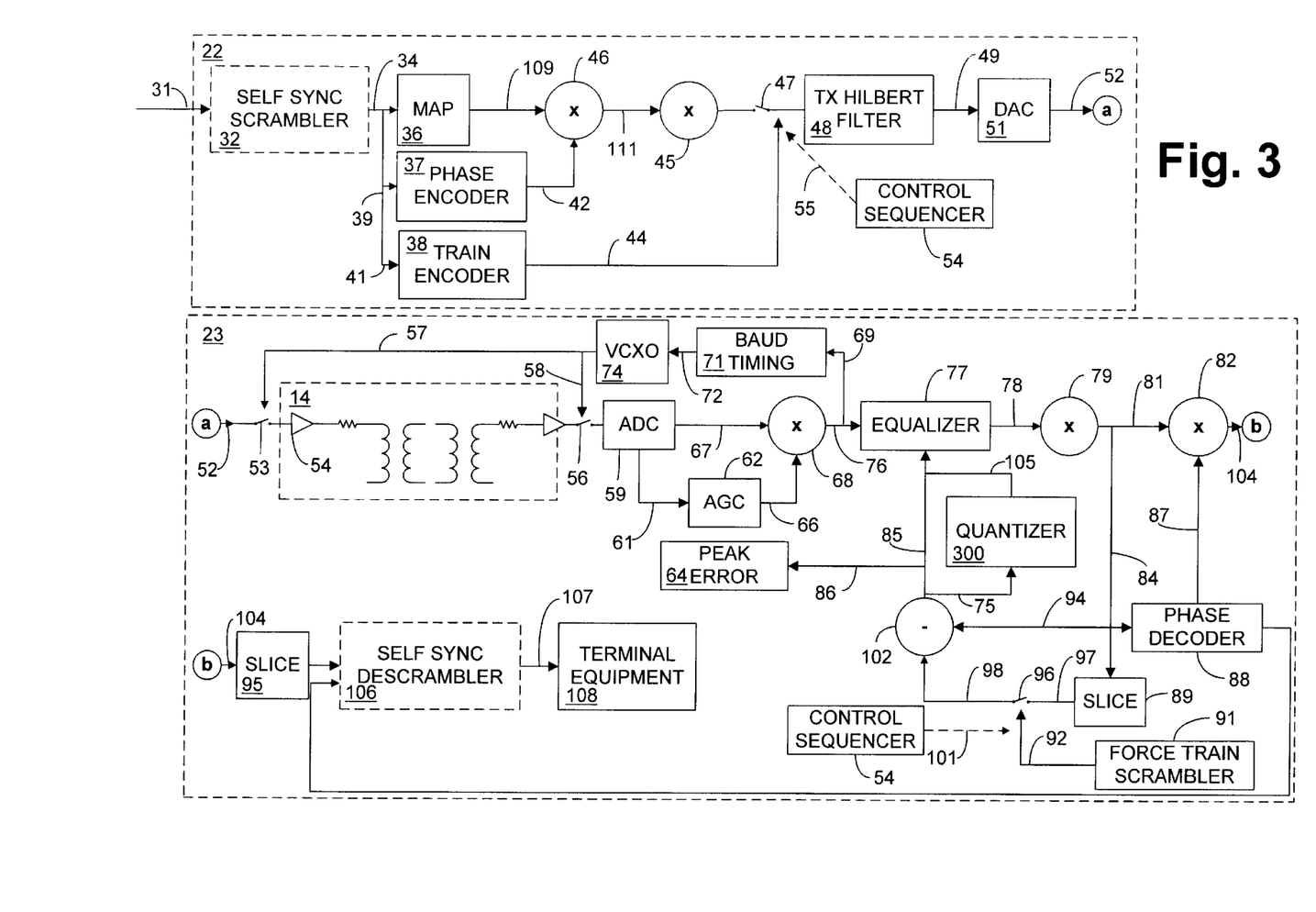
FIG. 3 is a block diagram illustrating a transmitter and a receiver containing one embodiment of the quantizer of the communications device of FIG. 2.

With reference now to FIG. 3, illustrated is a block diagram of a transmitter 22 and a receiver 23 containing one embodiment of the quantizer of the communications device of FIG. 2. An N bit word is input on line 31 to optional scrambler 32. Scrambler 32 can be either a self synchronized scrambler or a preset free running scrambler as is known in the art. For illustrative purposes, a self synchronizing scrambler is assumed. If scrambler 32 is employed, a scrambled N bit word is output on line 34.

The N-2 most significant bits (msb's) of the resulting word are supplied on line 34 to mapper 36, which maps the word into a signal space constellation resulting in a mapped word represented by a 2-dimensional vector, and then supplies the mapped word on line 109 to rotator 46.

Next, the 2 least significant bits (lsb's) on line 39 are operated upon by phase encoder 37. Phase encoder 37 is designed to develop a rotation vector using the 2 lsb's. This rotation vector is output on line 42 and combined in rotator 46 with the mapped word on line 109 to form a phase rotated signal, thus creating a symmetric signal space constellation. The details of the operation of phase encoder 37 have been omitted as they will be appreciated by those skilled in the art. Optionally, phase encoder 37 includes a differential encoder which encodes the 2 lsb's of the N bit word to develop 2 differential bits as known in the art.

Train encoder function 38 generates a predetermined sequence of symbols for the initial transmission in order to train the adaptive equalizer 77 in the receiver 23 of remote device 18. Control sequencer 54 activates switch 47 to select the train encoder function 38 when initializing the system. After the train encoder sequence is sent, control sequencer causes switch 47 to select line 111 for all normal data transmission.

Rotator 46 performs vector multiplication on the rotation vector on line 42 and the mapped word on line 109 to cause a phase rotation, thus producing the final quadrant symmetric signal space constellation on line 111 for input to scaler 45.

Scaler 45 multiplies the circular constellation by a scale function of the data rate and supplies a complex number comprising X and Y values to switch 47. The scale function allows a single table to be used to implement the mapper at all data rates.

The mapped and scaled signal space constellation is supplied through switch 47 to TX Hilbert filter 48 in the case of carrierless amplitude/phase (CAP) modulation. Alternatively, the mapped signal space constellation supplied by switch 47 can be modulated using any modulator. For example, the present invention is equally applicable to quadrature amplitude modulation (QAM) as is known in the art, or any other modulation scheme. The modulated signal is then sent on line 49 to digital-to-analog converter 51 for conversion to the analog domain for transmission on communication channel 14.

Still referring to FIG. 3, the received signal is received by analog to digital (ADC) converter 59 for conversion to the digital domain. Sampling switches 53 and 56 are driven by VCXO 74. This sampling is done at a multiple of the symbol rate of the modem, 192 kHz for a symbol rate of 64 KHz in the preferred embodiment. VCXO 74 is driven by baud timing device 71, which includes quantization noise compensator 200, the operation of which will be discussed in detail with respect to FIGS. 4 and 5. ADC 59 supplies an output on line 61 to automatic gain control circuit 62, and an output on line 67 to gain factor 68. AGC circuit 62 multiplies the received signal by gain factor 68 and supplies the AGC compensated signal on line 76 to equalizer 77. Equalizer 77 is a known in the art finite impulse response (FIR) filter with adaptive coefficients. The signal on line 76 is also supplied on line 69 to baud timing device 71 and will be discussed in detail below.

The equalized signal is supplied on line 78 to scaler 79 which operates on the received signal with a 1/scale factor. The 1/scale factor is a function of the data rate depending on the number of points in the signal space constellation. The outputs of scaler 79 are the normalized X and Y components representing the values of the symbols in the signal space constellation.

The normalized output of scaler 79 is supplied on line 84 to slicer 89, which performs the inverse operation of mapper 36. Because the signal is normalized, one slicer can be used for all data rates.

The normalized output of scaler 79 is also supplied to adder 102 on line 94 along with the output of slicer 89 on line 98. Adder 102 subtracts the output of the 1/scale factor from the output of the slicer on line 98 to obtain an error signal which is supplied on line 85 to update the finite impulse response (FIR) filter tap coefficients of equalizer 77 in a first preferred embodiment. In an alternative embodiment, to be discussed in detail with respect to FIG. 6, the output of adder 102 is supplied on line 75 to quantizer 300, which in turn supplies the coefficient update to equalizer 77 on line 105. The output of slicer 89 is first supplied on line 97 to sampling switch 96. As discussed with respect to transmitter 22, control sequencer 54 activates switch 96 to select force train scrambler 91 during the initial transmission time that train encoder function 38 in remote device 18 or control device 13 sends the predetermined training sequence for training equalizer 77. Once equalizer 77 is initially set, control sequencer 54 causes switch 96 to select line 97 for all normal data transmission.

The output of scaler 79 is also supplied to phase decoder 88 on line 84. Rotator 82 receives the output of scaler 79 on line 81 and the output of phase decoder 88 on line 87. Rotator 82 multiplies the X and Y values from scaler 79 with the decoded 2 lsb's for rotation into the base constellation subset. As in the transmitter, phase decoder 88 optionally includes a differential decoder to decode the 2 lsb's if they were differentially encoded in the transmitter.

The output of rotator 82 is supplied on line 104 to slicer 95, which decodes the original N-2 msb's. If scrambled in transmitter 22, the N-2 msb's from slicer 95 and the 2 lsb's from phase decoder 88 are supplied to self synchronizing descrambler 106, which optionally descrambles the N bit word and supplies the descrambled word on line 107 to terminal equipment 108. The operation of the transmitter and receiver will be appreciated by those skilled in the art.

Figure 4:
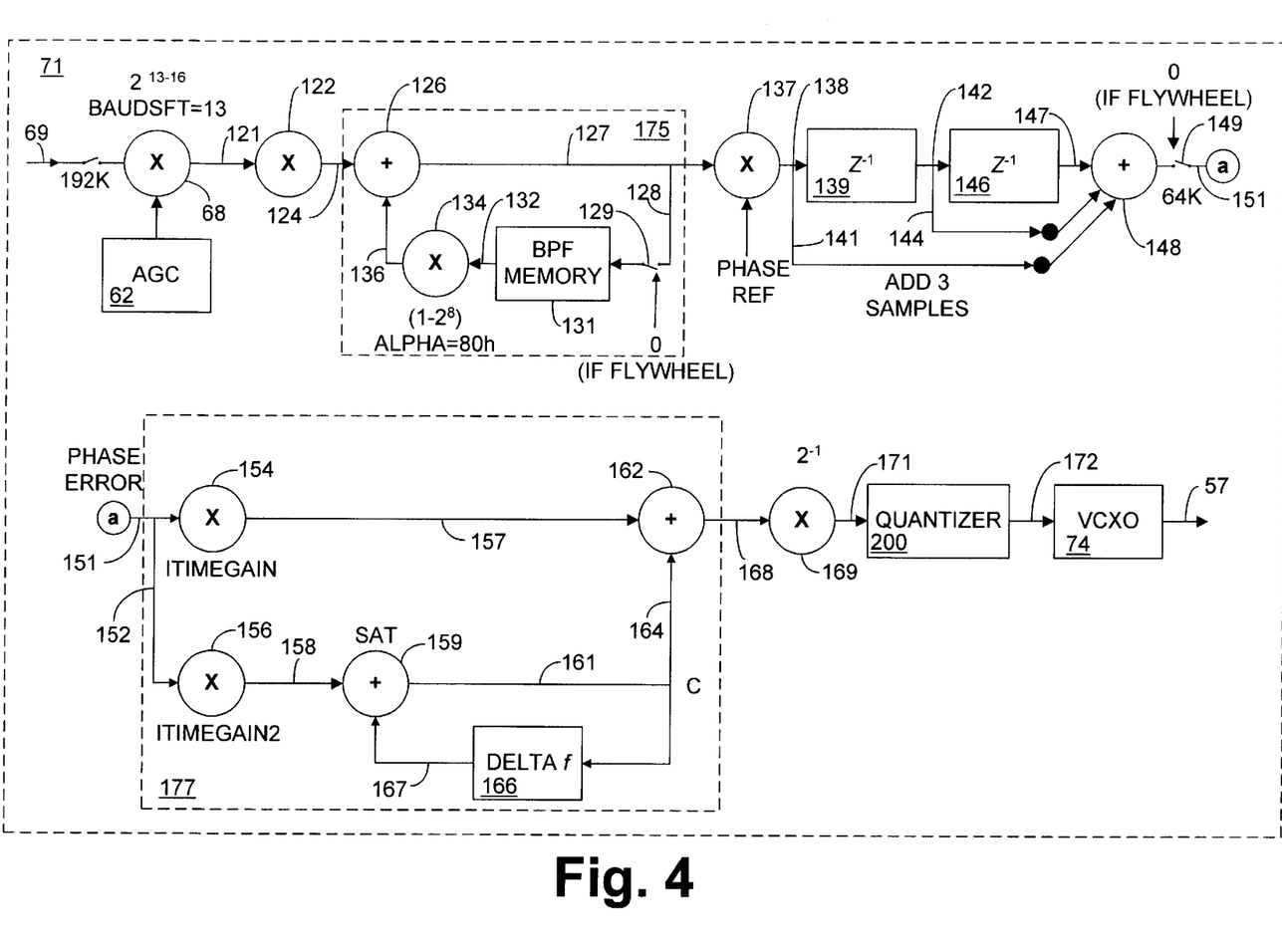
FIG. 4 is a schematic view illustrating the baud timing device of FIG. 3 including an embodiment of the quantizer of FIG. 2.

Referring now to FIG. 4, shown is a schematic view illustrating the baud timing device 71 of FIG. 3 including an embodiment of the quantizer 200 of FIG. 2.

The sampled signal on line 69 is supplied to gain factor 68 where the signal gain is adjusted by AGC circuit 62. The gain adjusted signal is then supplied on line 121 to scaler 122, which preferably scales the signal down by factor $2^{-3}$. This signal is then supplied on line 124 to digital high pass filter 175. Filter 175 includes adder 126, the output of which is supplied on line 127 to band pass filter memory device 131 on line 128 through switch 129. During periods when the signal may be degraded, as due to saturation by a local transmitter, switch 129 provides a zero into BPF memory device 131. Alternatively, switch 129 can be positioned to line 124 (the input to adder 126) in order to flywheel BPF 131. This will cause phase locked loop 177 to continue to operate at it's current frequency, or flywheel as is known in the art. Filter memory 131 is scaled by multiplier 134, then subtracted by adder 126 from the input signal to implement a band pass filter used to isolate the pilot tone that was transmitted by control device 13.

The filtered signal is then supplied on line 127 to multiplier 137 which multiplies the filtered signal by a stored phase reference. This signal is then averaged over one symbol period, or three samples, for the preferred embodiment. The signal on line 138 is averaged over one sample period by memory devices 139 and 146, the output of which are supplied on lines 141, 144 and 147, respectively, to adder 148. The output of adder 148 is supplied to switch 149, which is configured to zero the phase error such that the PLL remains at the previous frequency, and to provide flywheel operation as needed when the input signal is degraded. For initial acquisition, the phase reference can be preset by a preset device. As is known in the art, preset may be accomplished by a wide band edge detector or by spectrum analysis in order to improve the acquisition time of phase locked loop (PLL) 177. The signal is then supplied on line 151 to PLL 177 which scales and integrates the signal to determine any static frequency offset. Scalers 154 and 156 are scale factors typically $2^{-2}$ and $2^{-8}$, respectively. Adder 159 is a saturating adder such that if the sum of the signal on lines 158 and 167 would overflow, then the maximum allowed value is used. Typically, plus or minus 32767 for 16 bit arithmetic. Memory 166 stores the previous output of adder 159 and its value is proportional to the frequency offset between crystal oscillators in remote device 18 and control device 13.

The phase error on line 157 and frequency offset on line 164 are added by adder 162 and output from PLL 177 on line 168 to scaler 169, which performs typically a $2^{-1}$ scale function. The output of scaler 169 is supplied on line 171 to quantizer 200. The operation of quantizer 200 will be discussed in detail with respect to FIG. 5. The output of quantizer 200 is supplied on line 172 and used to drive VCXO 74. VCXO 74 generates the low jitter timing clock signals that are used to derive the sample signal for transmit sample rate switch 53 on line 57 and receive sample rate switch 56 on line 58 of FIG. 3. VCXO 74, can be for example the VECTRON Technologies, Inc., V-series VCXO, which supplies a low jitter clock pulse. This ensures that signals transmitted by remote device 18 are synchronized to the timing of control device 13.

Figure 5:
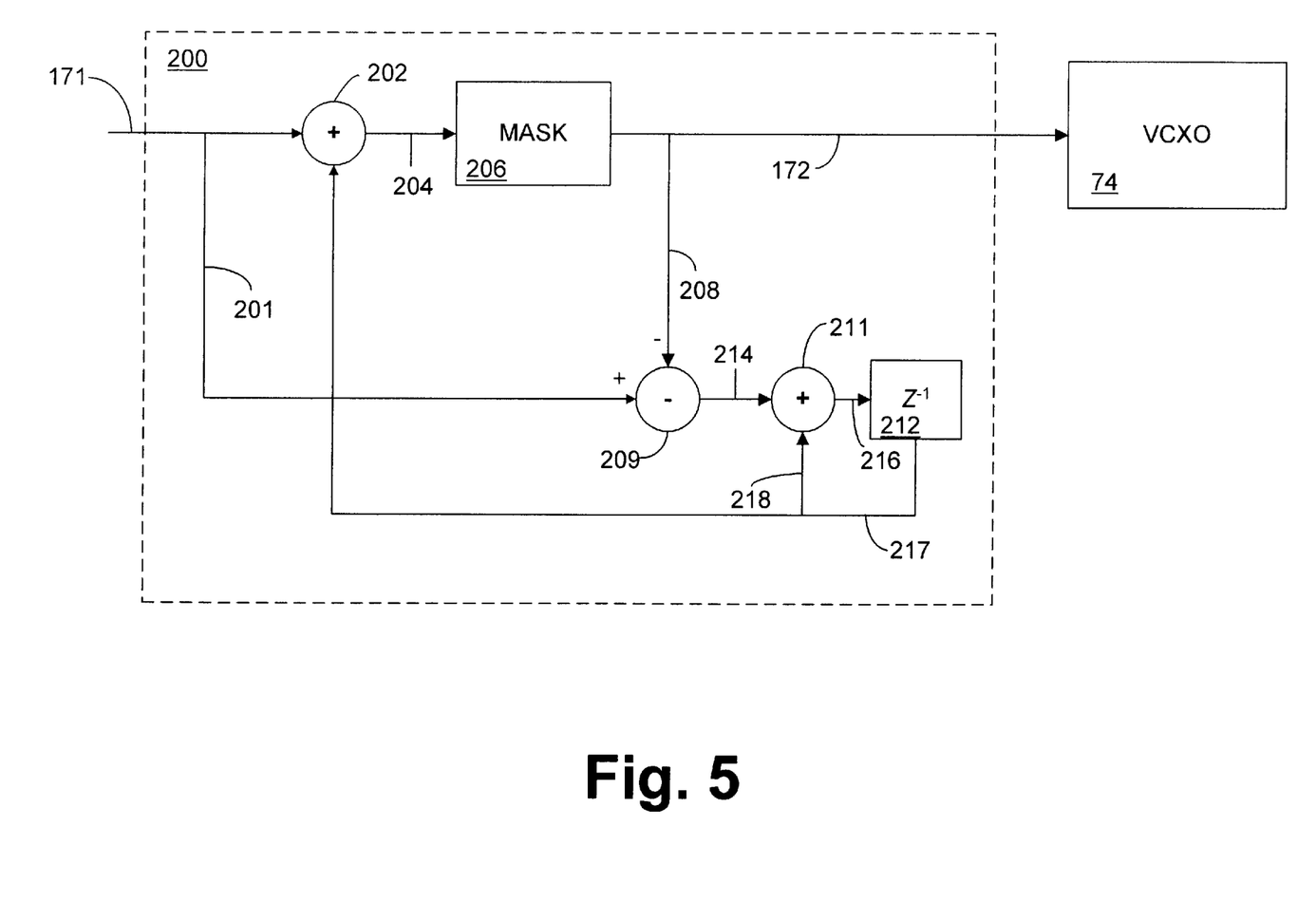
FIG. 5 is a schematic view illustrating a first embodiment of the quantizer of FIG. 4.

Referring now to FIG. 5, shown is a schematic view illustrating a first embodiment of the quantizer 200 of FIG. 4. The scaled phase error and frequency offset output signal, hereinafter referred to as a control signal, is supplied on line 171 to quantizer 200. The control signal is added in adder 202 to an accumulated quantization error signal stored in memory device 212 that is supplied to adder 202 on line 217. The resulting signal on line 204 is masked, or converted by mask device 206 to two or more voltage levels, which drive VCXO 74 on line 172. This output can be a single bit output, i.e., a two voltage level output, thus significantly reducing the cost of driving VCXO 74 by eliminating the need for an accurate and costly 8 bit DAC. Generally, fewer voltage levels translate into reduced cost. These voltage levels on line 172 are supplied on line 208 to subtractor 209 where they are also subtracted from the control signal on line 201 to provide a quantization error signal on line 214. This quantization error signal on line 214 is added in adder 211 to the accumulated quantization error signal supplied on line 218 from memory device 212 to develop an updated, or new, quantization error signal on line 216 that will be stored in memory device 212 for use in compensating subsequent samples. Thus, the accumulated quantization error is always known within quantizer 200 and can be corrected by adder 202 at the input to masker 206. Linear, as well as nonlinear, voltage levels can be used so long as the function is known by the mask operation. The quantization noise compensator knows the accumulated quantization error and predicts the necessary compensation on the next sample without waiting for corrective feedback through the system. Without the quantization noise compensator excessive delay in the feedback loop could cause significant jitter in the VCXO signal. The quantization noise compensator avoids the excessive jitter that otherwise could be present in the VCXO signal due to a single bit control signal.

Figure 6:
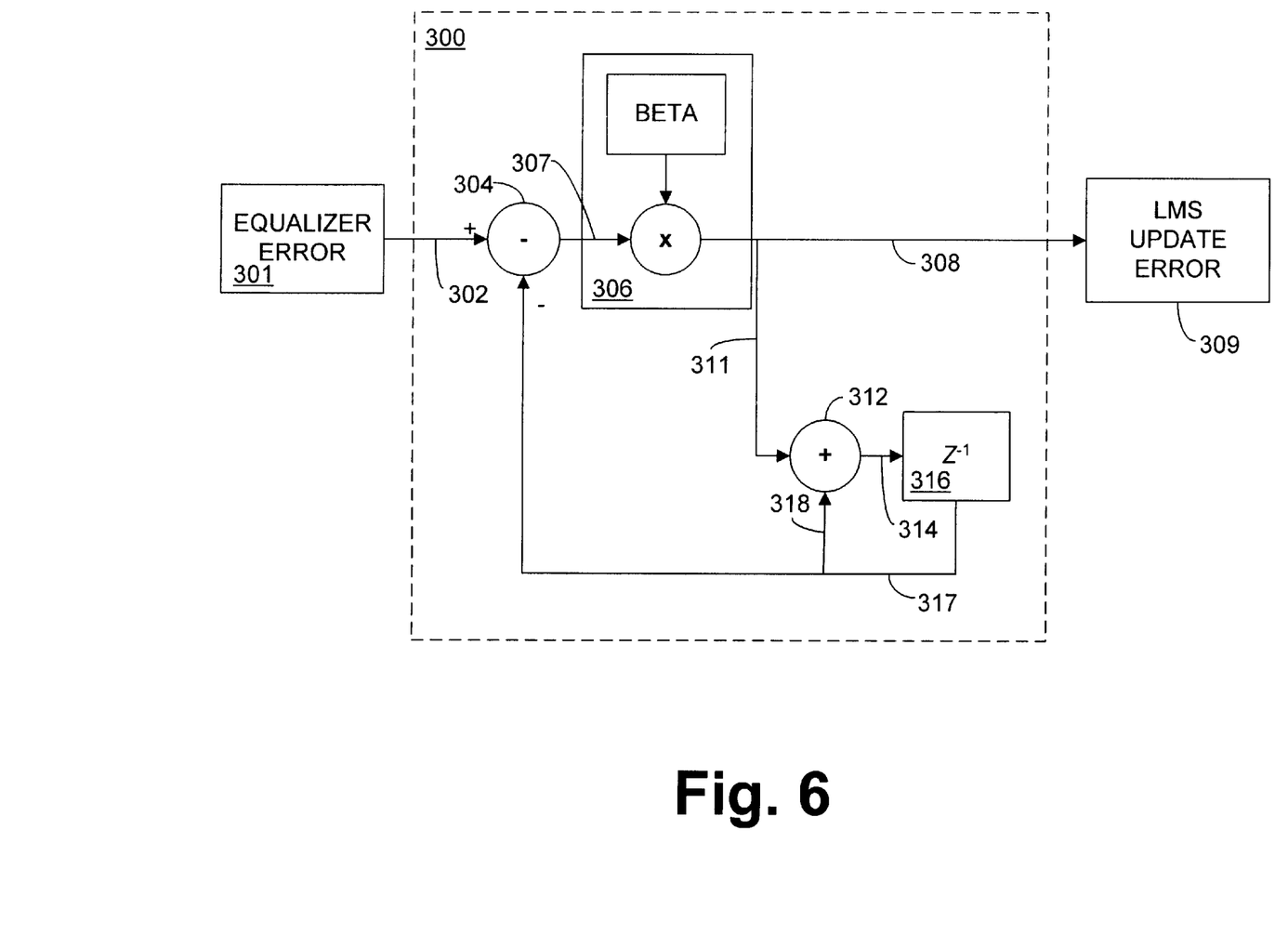
FIG. 6 is a schematic view illustrating an alternative embodiment of the quantizer of FIG. 3.

Referring now to FIG. 6 shown is a schematic view illustrating an alternative embodiment of the quantizer 300 of FIG. 3. This embodiment of the invention is applicable for use in updating the coefficients of various adaptive control systems, but for simplicity, will be discussed in the context of updating the adaptive equalizer coefficients of communication devices.

The Least Mean Squares (LMS) algorithm is used to update the coefficients of many adaptive control systems, such as the adaptive equalizer used in communications devices. Any long term bias, or DC offset, in the error signal used by the update algorithm may cause the target coefficients to grow and/or diverge. Divergence may take place over a time period of hours or days, but will eventually degrade the performance of synchronous communications systems that operate twenty four hours a day. The limited accuracy of digital signal processors (DSP)'s may cause quantization error to build. As is known in the art, it is necessary to scale the error signal or correlation product used to update coefficients by a constant "Beta" to assure stability of the LMS algorithm. Beta is a scale factor, typically on the order of $2^{-8}$. This and other operations in a feedback loop may result in an undesirable, small bias, or DC offset.

This alternative embodiment of the quantization noise compensator apparatus and method can be used to compensate this small long term bias. As shown in FIG. 6, because the long term bias must be zero, the feed forward signal into subtraction device 209 of FIG. 5 is removed.

The accumulated quantization error signal on line 314 and stored in memory device 316 will measure only the long term bias of the final error signal on line 311 resulting from all operations in the feedback loop. This long term bias is compensated by subtractor 304. In this embodiment, the mask operation is replaced by beta scaler device 306, which represents the final beta scaler operation in the LMS algorithm. The output on line 308 is the bias free error signal that is used to update the coefficients of block 309. The accumulated quantization error signal is supplied on line 317 to subtractor 304 for subtraction from the equalizer error signal input on line 302. This signal becomes the input to beta scaler 306. Using this embodiment of the quantization noise compensation apparatus and method, long term divergence of the adaptive coefficients is prevented. Equalizers typically require more than 16 bits of accuracy in their coefficient memory. By employing the concepts of the presently disclosed quantizer, coefficient accuracy can be reduced to 16 bits, thus reducing the amount of memory required for coefficient storage. For long term compensation, memory device 316 may be double precision, or 32 bits. In this application, the most significant 16 bits are fed back on line 317 to subtractor 304.

With respect to both FIGS. 5 and 6, for complex devices of two or more dimensions, multiple compensators can be applied independently to each dimension, i.e., memory devices 212 and 316 can be n-dimensional requiring n memory locations.

It will be obvious to those skilled in the art that many modifications and variations may be made to the preferred embodiments of the present invention, as set forth above, without departing substantially from the principles of the present invention. For example, the quantization noise compensator may have application in other control systems such as vehicle guidance and control systems. Processors used in these systems have more accuracy than the mechanical systems that implement the actions. The resulting quantization error can be compensated immediately by the quantization noise compensator of the present invention without awaiting detection of the error and feedback from the guidance system. This is merely one possible example of a modification of the present invention. Indeed, the present invention is applicable to any control system that incorporates an integrator in its feedback loop, thereby reducing the buildup of noise within the control loop. All such modifications and variations are intended to be included herein within the scope of the present invention, as defined in the claims that follow.

Therefore the following is claimed:

1. An apparatus for noise compensation, the apparatus comprising:
    a first adder configured to receive a control signal and add said control signal with an accumulated quantization error signal resulting in a combined signal;
    a masker configured to convert said combined signal to a plurality of voltage levels;
    a subtractor configured to subtract said plurality of voltage levels from said control signal resulting in a quantization error signal;
    a second adder configured to add said accumulated quantization error signal with said quantization error signal resulting in a new accumulated quantization error signal; and
    a memory device for storing said accumulated quantization error signal.

2. The apparatus as defined in claim 1, wherein said control signal is a 16 bit signal.

3. The apparatus as defined in claim 1, wherein said control signal is a 32 bit signal.

4. The apparatus as defined in claim 1, wherein said plurality of voltage levels are linear.

5. The apparatus as defined in claim 1, wherein said plurality of voltage levels are nonlinear.

6. The apparatus as defined in claim 1, wherein said memory device is n dimensional.

7. An apparatus for correcting bias in a feedback loop, the apparatus comprising:
    a subtractor configured to receive an error signal and subtract an accumulated quantization error signal from said error signal resulting in a combined signal;
    a Beta scalar configured to convert said combined signal to a bias free error signal;
    an adder configured to add said bias free error signal with said accumulated quantization error signal resulting in a new quantization error signal; and
    a memory device for storing said accumulated quantization error signal.

8. The apparatus as defined in claim 7, wherein said error signal is a 16 bit signal.

9. The apparatus as defined in claim 7, wherein said control signal is a 32 bit signal.

10. The apparatus as defined in claim 7, wherein said memory device is n dimensional.

11. A method for noise compensation, the method comprising the steps of:
    adding a control signal with an accumulated quantization error signal resulting in a combined signal;
    converting said combined signal to a plurality of voltage levels;
    subtracting said plurality of voltage levels from said control signal resulting in a quantization error signal;
    adding said accumulated quantization error signal with said quantization error signal resulting in a new accumulated quantization error signal;
    storing said accumulated quantization error signal; and
    using said plurality of voltage levels to control an integrator.

12. The method as defined in claim 11, wherein said control signal is a 16 bit signal.

13. The method as defined in claim 11, wherein said control signal is a 32 bit signal.

14. The method as defined in claim 11, wherein said plurality of voltage levels are linear.

15. The method as defined in claim 11, wherein said plurality of levels are nonlinear.

16. The method as defined in claim 11, wherein said accumulated quantization error signal is stored in an n dimensional memory device.

17. A method for correcting bias in a feedback loop, the method comprising the steps of:
    receiving an error signal in a subtractor, said subtractor configured to subtract an accumulated quantization error signal from said error signal resulting in a combined signal;
    converting said combined signal to a bias free error signal;
    adding said bias free error signal with said accumulated quantization error signal resulting in a new quantization error signal;
    storing said accumulated quantization error signal; and
    using said bias free error signal to correct bias in said feedback loop.

18. The method as defined in claim 17, wherein said error signal is a 16 bit signal.

19. The method as defined in claim 17, wherein said control signal is a 32 bit signal.

20. The method as defined in claim 17, wherein said accumulated quantization error signal is stored in an n dimensional memory device.

21. A computer readable medium having a program for noise compensation, the program containing logic configured to perform the steps of:
    adding a control signal with an accumulated quantization error signal resulting in a combined signal;
    converting said combined signal to a plurality of voltage levels;

subtracting said plurality of voltage levels from said control signal resulting in a quantization error signal;

adding said accumulated quantization error signal with said quantization error signal resulting in a new accumulated quantization error signal;

storing said accumulated quantization error signal; and using said plurality of voltage levels to control an integrator.

22. The computer readable medium having a program as defined in claim 21, wherein said control signal is a 16 bit signal.

23. The computer readable medium having a program as defined in claim 21, wherein said control signal is a 32 bit signal.

24. The computer readable medium having a program as defined in claim 21, wherein said plurality of voltage levels are linear.

25. The computer readable medium having a program as defined in claim 21, wherein said plurality of levels are nonlinear.

26. The computer readable medium having a program as defined in claim 21, wherein said accumulated quantization error signal is stored in an n dimensional memory device.

27. A computer readable medium having a program for correcting bias in a feedback loop, the program containing logic configured to perform the steps of:

receiving an error signal in a subtractor, said subtractor configured to subtract an accumulated quantization error signal from said error signal resulting in a combined signal;

converting said combined signal to a bias free error signal;

adding said bias free error signal with said accumulated quantization error signal resulting in a new quantization error signal;

storing said accumulated quantization error signal; and using said bias free error signal to correct bias in said feedback loop.

28. The computer readable medium having a program as defined in claim 27, wherein said error signal is a 16 bit signal.

29. The computer readable medium having a program as defined in claim 27, wherein said control signal is a 32 bit signal.

30. The computer readable medium having a program as defined in claim 27, wherein said accumulated quantization error signal is stored in an n dimensional memory device.

* * * * *

UNITED STATES PATENT AND TRADEMARK OFFICE
CERTIFICATE OF CORRECTION

PATENT NO. : 6,137,809
DATED : October 24, 2000
INVENTOR(S) : Martinez et al.

It is certified that error appears in the above-identified patent and that said Letters Patent is hereby corrected as shown below:

In the Related U.S. Application Data, add the phrase --Provisional No. 60/057,046, Aug. 22, 1997.--

Column 8,
Line 44, after the word "undesirable", delete the symbol ",".

Signed and Sealed this

Nineteenth Day of June, 2001

*Attest:*

NICHOLAS P. GODICI
*Attesting Officer*   *Acting Director of the United States Patent and Trademark Office*